United States Patent [19]
Fukatsu et al.

[11] Patent Number: 5,279,981
[45] Date of Patent: Jan. 18, 1994

[54] METHOD OF REDUCING THE TRAP DENSITY OF AN OXIDE FILM FOR APPLICATION TO FABRICATING A NONVOLATILE MEMORY CELL

[75] Inventors: Shigemitsu Fukatsu, Okazaki; Akiyoshi Asai, Nisshin, both of Japan

[73] Assignee: Nippondenso Co., Ltd., Kariya, Japan

[21] Appl. No.: 868,572

[22] Filed: Apr. 15, 1992

[30] Foreign Application Priority Data

Apr. 15, 1991 [JP] Japan .................. 3-82548

[51] Int. Cl.$^5$ .......................................... H01L 21/324
[52] U.S. Cl. ...................... 437/43; 437/247; 437/941
[58] Field of Search ............. 437/43, 52, 247, 941, 437/949; 148/DIG. 3, DIG. 22

[56] References Cited

U.S. PATENT DOCUMENTS

| | | | |
|---|---|---|---|
| 4,154,873 | 5/1979 | Hickox et al. | 437/941 |
| 4,331,709 | 5/1982 | Risch et al. | 437/241 |
| 4,447,272 | 5/1984 | Saks | 437/941 |
| 5,010,024 | 4/1991 | Allen et al. | 437/52 |
| 5,017,979 | 5/1991 | Fujii et al. | 257/319 |
| 5,019,533 | 5/1991 | Cuddihy et al. | 437/247 |

Primary Examiner—Brian E. Hearn
Assistant Examiner—C. Chaudhari
Attorney, Agent, or Firm—Cushman, Darby & Cushman

[57] ABSTRACT

The present invention is intended to provide a method of fabricating an EEPROM having excellent endurance characteristics. A work obtained by processing a substrate (1) by a wafer processing process including a passivating process and having a tunnel oxide film, an aluminum wiring film and a passivation film is subjected to a low-temperature heat treatment employing a processing temperature of about 250° C. and a processing time on the order of 50 hr in a thermostatic oven (20) in the presence of nitrogen gas. The low-temperature heat treatment reduces trap sites produced in the tunnel oxide film by a plasma CVD process carried out to form the passivation film to repair the tunnel oxide film damaged by the plasma CVD process and to improve the endurance characteristics. The aluminum wiring film is not deteriorated by the low-temperature heat treatment because the low-temperature heat treatment employs a relatively low processing temperature.

17 Claims, 10 Drawing Sheets

METHOD OF REDUCING THE TRAP DENSITY OF AN OXIDE FILM FOR APPLICATION TO FABRICATING A NONVOLATILE MEMORY CELL

BACKGROUND OF THE INVENTION

1. Field of the Invention

The present invention relates to a method of reducing the trap density of an oxide film formed in a semiconductor device and, more particularly, to a method of reducing the trap density of an oxide film formed in a semiconductor device suitable for application to fabricating a nonvolatile memory cell.

2. Description of the Related Art

An EEPROM of a floating gate construction having a floating gate electrode formed under an insulating layer (oxide film) underlying a control gate electrode is a known nonvolatile memory cell.

This EEPROM has a thin oxide film (tunnel region) between a drain and a floating gate electrode. Electrons are injected through the thin oxide film (tunnel oxide film) into the floating gate or electrons are removed from the floating gate through the thin oxide film to erase or write information.

In writing or erasing information, an electric field of a high intensity is applied to the thin tunnel oxide film to allow electron to tunnel through the thin tunnel oxide film. Therefore, it is essential that the thin tunnel oxide film is capable of withstanding repeated application of a high-intensity electric field thereto to enhance the endurance characteristics (which are represented by the number of possible data rewriting cycles) of the EEPROM.

The endurance characteristics may be improved if the breakdown of the tunnel oxide film attributable to the local concentration of the high-intensity electric field applied to the EEPROM in rewriting data can be prevented and it is considered that the endurance characteristics can be effectively improved by forming the tunnel oxide film in a uniform film quality.

A high-temperature annealing in an $N_2$ atmosphere at a high temperature on the order of 1000° C. is a means for improving the film quality of an oxide film.

However, it was found through experiments conducted by the inventors of the present invention that the tunnel oxide film is damaged and trap sites are formed by a plasma CVD process for forming a silicon nitride (SiN) film having an excellent hygroscopic property as a passivation film.

Thus, if the tunnel oxide film has trap sites, electrons are liable to be trapped when tunnel current flows through the tunnel oxide film in rewriting data in the EEPROM, the intensity of the internal electric field of the tunnel oxide film increases with the increase of the trapped electrons and, finally, the breakdown of the tunnel oxide film occurs.

Since the tunnel oxide film damaged in forming the passivation film is repaired after an aluminum electrode has been formed, it is impossible to improve the quality of the tunnel oxide film by high-temperature annealing.

SUMMARY OF THE INVENTION

Accordingly, it is an object of the present invention to provide a method of repairing a damaged tunnel oxide film of, for example, a nonvolatile memory cell, after a wafer processing process including a passivating process.

The inventors of the present invention found, through experiments, that trap density can be reduced by subjecting a tunnel oxide film to a low-temperature heat treatment, thereby improving the life of the nonvolatile memory cell, even if trap sites are formed in the tunnel oxide film by damage inflicted on the tunnel oxide film in a passivating process. Although the low-temperature heat treatment process employs a relatively low processing temperature, it is possible to reduce the trap density of the tunnel oxide film to a satisfactorily low extent by properly setting the processing time.

In one aspect of the present invention, a method of fabricating a nonvolatile memory cell, which changes the threshold value of a MOS transistor by arresting carriers between the gate and the substrate MOS transistor for nonvolatile data storage, comprises:

an oxide film forming process for forming a tunnel oxide film of a thickness allowing carriers to tunnel therethrough when an electric field is applied across the gate and the substrate;

a low-temperature heat treatment process for maintaining the substrate provided with the tunnel oxide film at a predetermined processing temperature for a processing time;

wherein the processing time is determined according to the predetermined processing so that the density of traps produced in the tunnel oxide film can be reduced.

This method of fabricating a nonvolatile memory cell is able to reduce trap sites produced in the tunnel oxide film by heating the tunnel oxide film at a relatively low temperature and is capable of repairing the damaged tunnel oxide film even after the completion of a wafer processing process including a passivating process.

DETAILED DESCRIPTION OF THE PREFERRED EMBODIMENTS

Preferred embodiments of the present invention will be described hereinafter with reference to the accompanying drawings.

Figure 1:
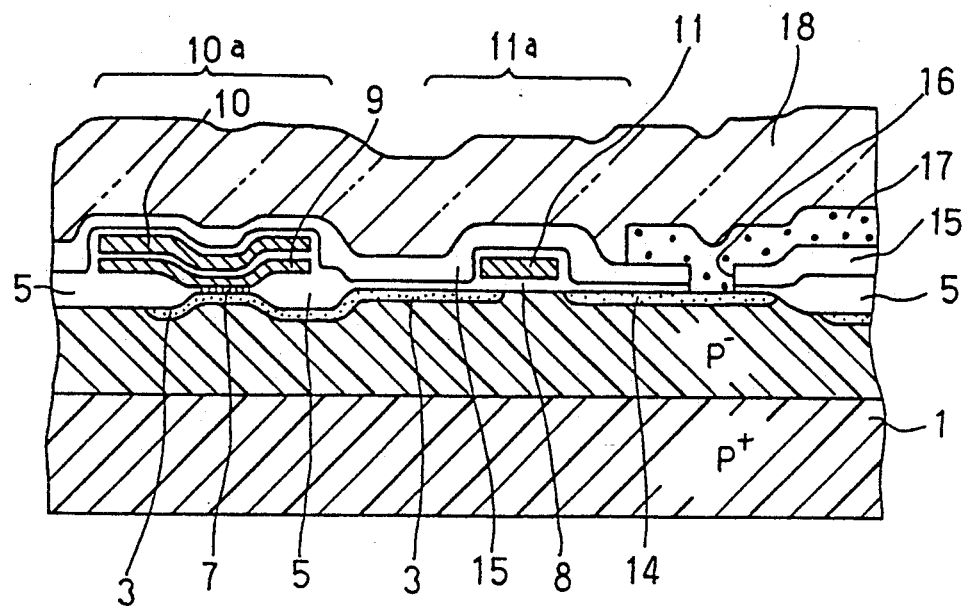
FIG. 1 is a sectional view of an EEPROM of a FLOTOX construction fabricated by a nonvolatile memory cell fabricating method in a preferred embodiment according to the present invention.

FIG. 1 is a sectional view of an EEPROM of a FLOTOX construction fabricated by a nonvolatile memory cell fabricating method in a preferred embodiment according to the present invention, in which the source layer of a memory transistor 10a is not included in this cross section. The nonvolatile memory cell fabricating method will be described hereinafter with reference to FIGS. 2 to 15.

Figure 2:
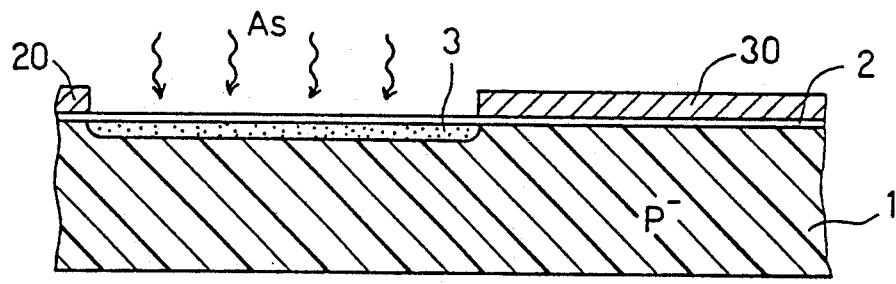
FIGS. 2 to 14 are sectional views of assistance in explaining steps of the nonvolatile memory cell fabricating method, showing a semiconductor device in sequential steps of the nonvolatile memory cell fabricating method.

In FIG. 2, after forming a p$^-$-type well layer, not shown, and an n$^-$-type well layer, not shown, in the surface of a Si substrate 1, a pad oxide film 2 of a thickness in the range of 400 to 500Å is formed in the surface of the Si substrate 1 by thermal oxidation. Then, As (arsenic) is introduced into the surface of the work, i.e., the Si substrate 1 coated with the pad oxide film 2, to form a buried n$^+$-type layer 3 for supplying electrons to a floating gate under a tunnel oxide film, by an ion implantation process using a resist mask 30 having an opening corresponding to the buried n$^+$-type layer 3 region. Then, the resist mask 30 is stripped. Process conditions for the ion implantation process are, for example, 150 keV and 1 to $3 \times 10^{15}$ dose/cm$^2$. As shown in FIG. 1, the buried n$^+$-type layer 3 is formed in a pattern corresponding to the drain layer of the memory transistor 10a and the source layer of a selection transistor 11a. The buried n$^+$-type layer 3 has a surface concentration on the order of $10^{18}$ to $10^{19}$/cm.

Then, a Si$_3$N$_4$ (silicon nitride) film 4 is deposited in a thickness in the range of 1000 to 2000Å over the entire surface of the work. Then, the Si$_3$N$_4$ film 4 is subjected to a selective plasma etching process using a resist mask having openings corresponding to regions in which a field oxide film is to be formed by LOCOS.

Figure 3:
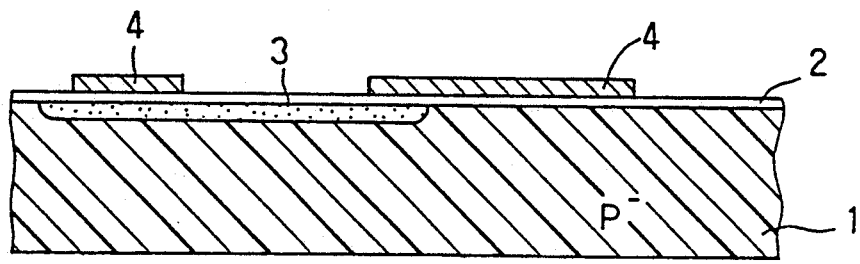

Then, the resist mask is removed. Thus, the Si$_3$N$_4$ film 4 is etched in a pattern of Si$_3$N$_4$ tunnel regions as shown in FIG. 3. Then, n$^+$-type and p$^+$-type channel stoppers, not shown, are formed by ion implantation.

Figure 4:
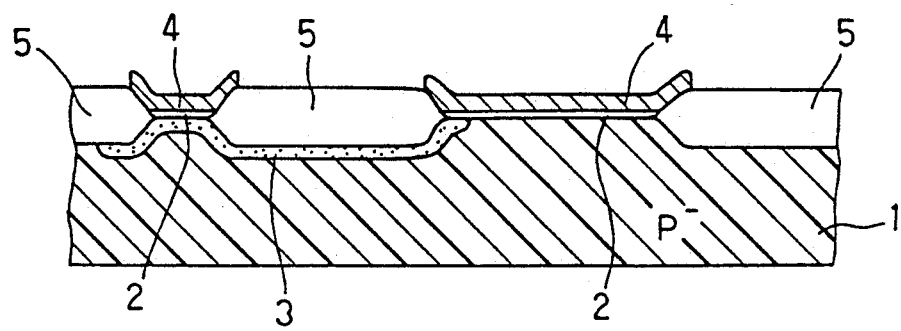
Figure 5:
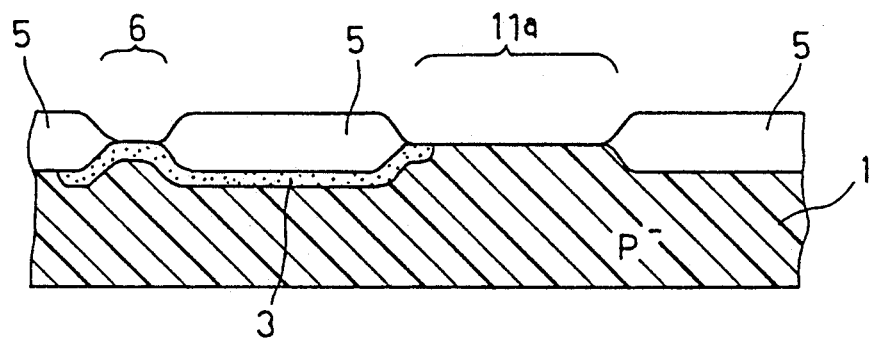

Then, the work is subjected to wet oxidation, for example, at 950° C. for 7 hr to form a field oxide film 5 as shown in FIG. 4 in a thickness in the range of 5000 to 10,000Å by LOCOS. Subsequently, the Si$_3$N$_4$ film 4 is removed by a H$_3$PO$_4$ solution and the pad oxide film 2 is removed by a HF solution in a state as shown in FIG. 5.

Figure 6:
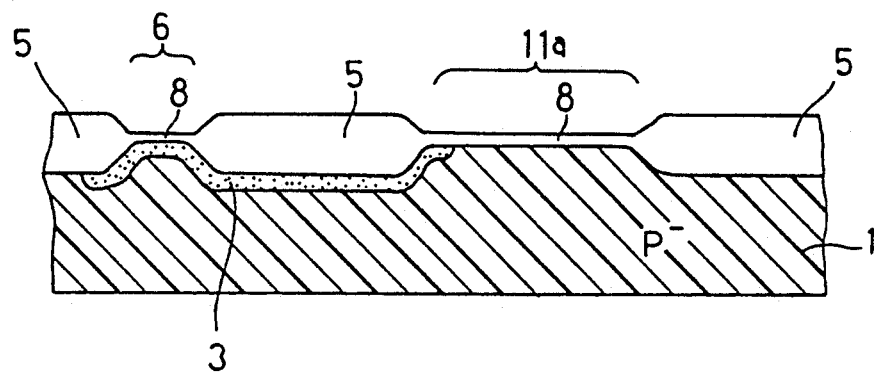
Figure 7:
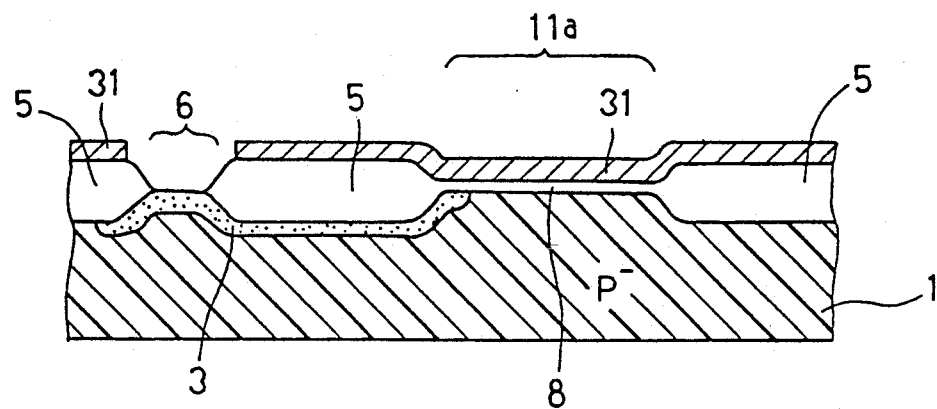
Figure 8:
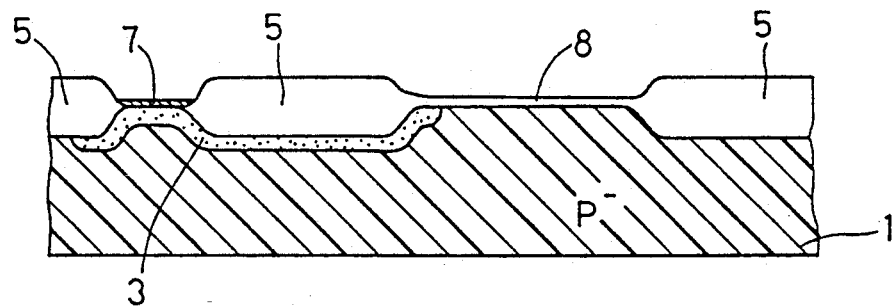

Then, the work is subjected to oxidation at 1000° C. to form a gate oxide film 8 of a thickness in the range of 300 to 500Å for the gate electrodes of peripheral transistors including the selection transistor 11a (FIG. 6). A resist film 31 having an opening corresponding to a region in which a tunnel region 6 is to be formed is formed over the work as shown in FIG. 7 and the work is subjected to etching using a HF solution to remove a portion of the gate oxide film 8 corresponding to the tunnel region 6 in the buried n$^+$-type layer 3. After removing the resist mask 31, the work is exposed to light emitted by a halogen lamp at 1150° C. for a time in the range of 10 to 40 sec in an O$_2$ atmosphere to form a thin oxide film 7 of a thickness in the range of 50 to 150Å in the region for forming the tunnel region 6 as shown in FIG. 8. The oxide film 7 serves as a tunnel oxide film through which electrons are injected into and extracted from the floating gate.

Figure 9:
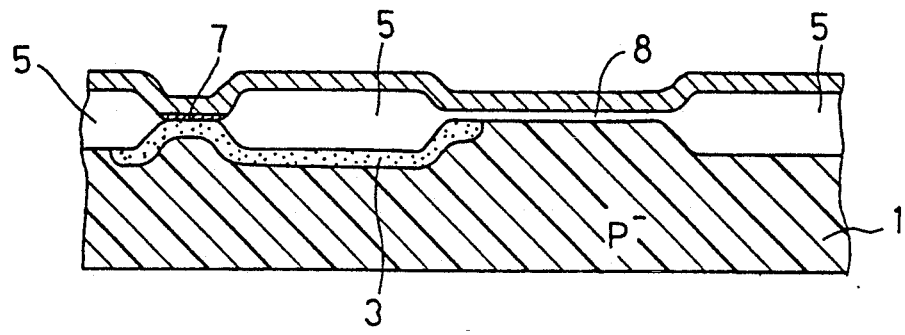
Figure 10:
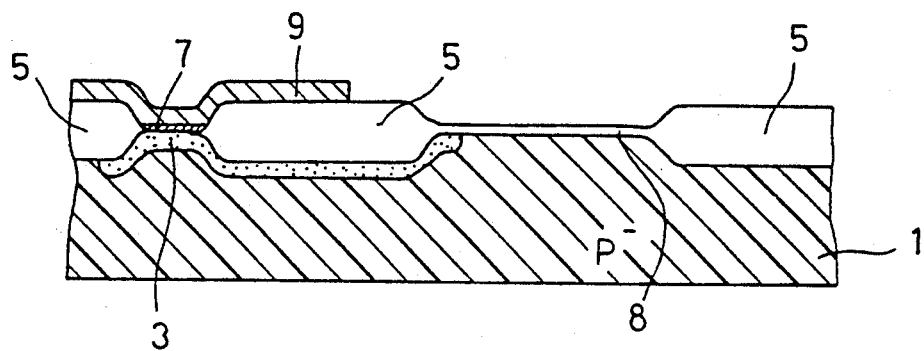
Figure 11:
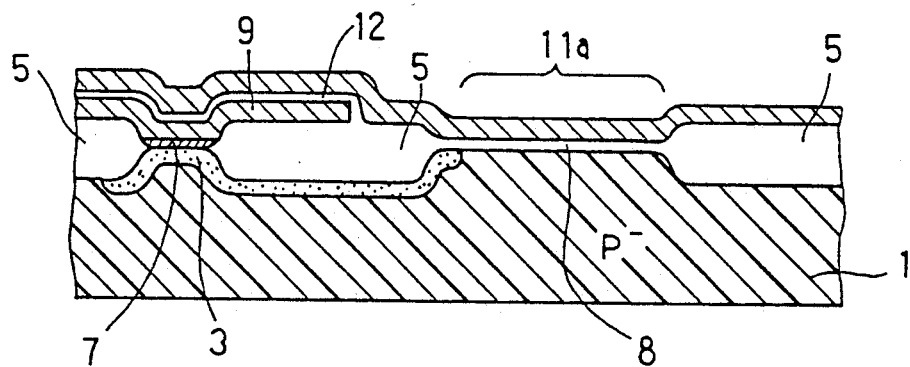
Figure 12:
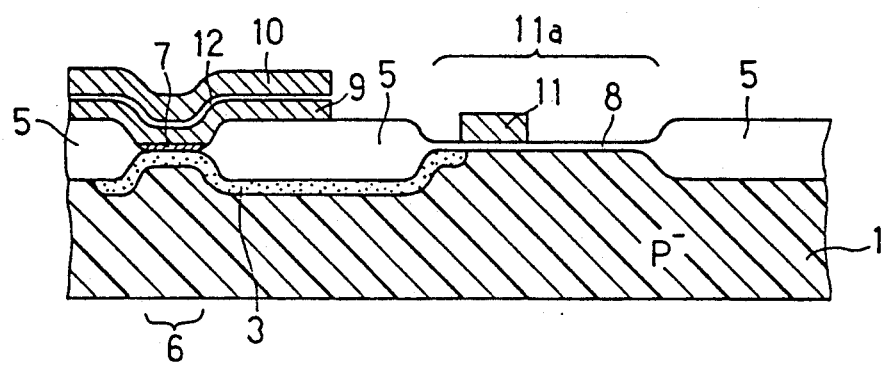

Then, as shown in FIG. 9, a polycrystalline silicon film of a thickness on the order of 2000Å is formed over the entire surface of the work, phosphorus is diffused in the polycrystalline silicon film at 980° C. for 10 to 30 min, and then, as shown in FIG. 10, the polycrystalline silicon film is etched to form a floating gate 9. It is also possible to remove the oxide film 8 by a HF solution in a state shown in FIG. 10 and to form the oxide film 8 again simultaneously with the oxide film 12. A polycrystalline silicon film of a thickness on the order of 4000Å is formed over the entire surface of the work, and then phosphorus is diffused into the polycrystalline silicon film at 980° C. for, for example, 20 min. Then, the polycrystalline silicon film is etched to form a control gate 10 and a selection gate 11 for the selection transistor 11a as shown in FIG. 12.

Figure 13:
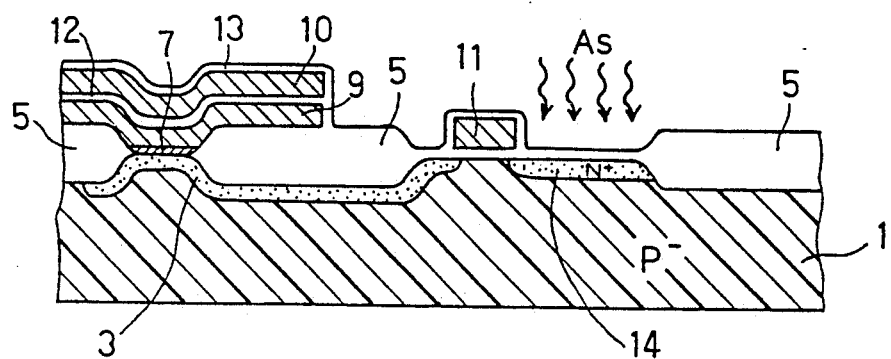
Figure 14:
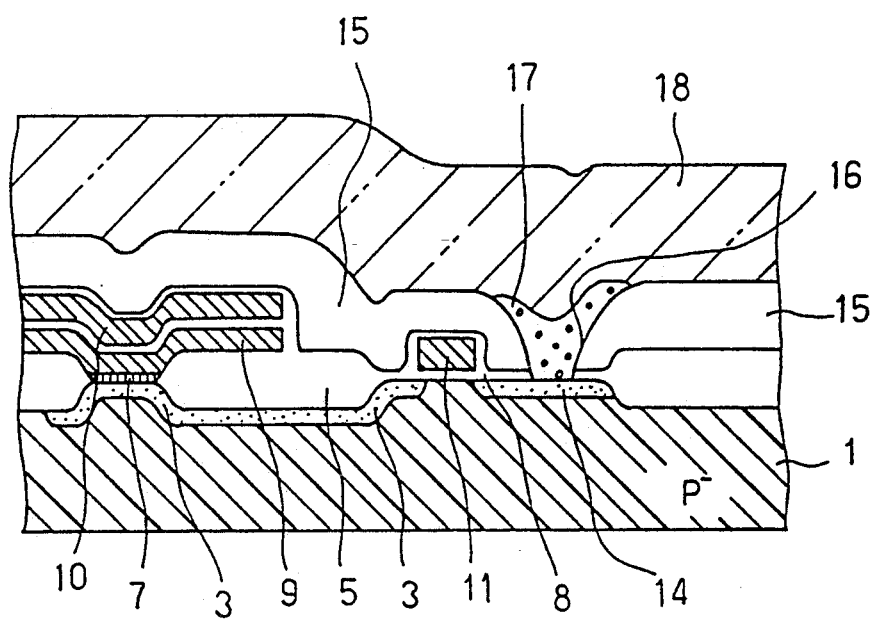

Then, as shown in FIG. 13, an oxide film 13 of a thickness on the order of 800Å is formed and As or the like is injected into the oxide film 13 by ion implantation to form an n$^+$-type drain layer 14 for the selection transistor 11a and a source layer, not shown, for the memory transistor 10a. An n$^-$-type offset region may be formed in the drain layer 14 of the selection transistor 11a to enhance the withstand voltage of the selection transistor 11a. Then, as shown in FIG. 14, a layer insulating film 15 of PSG or the like is formed, a contact hole 16 is formed in the layer insulating film 15, an aluminum film 17 is formed over the entire surface of the work, the aluminum film 17 is etched in an aluminum wiring pattern, and then the aluminum wiring 17 is sintered for example, at 450° C. for about 30 min. Then, a silicon nitride film (p-SiN) of a thickness on the order of 16000Å is deposited by a plasma CVD process of 380° C. and about 60 min to form a passivation film 18.

Figure 15:
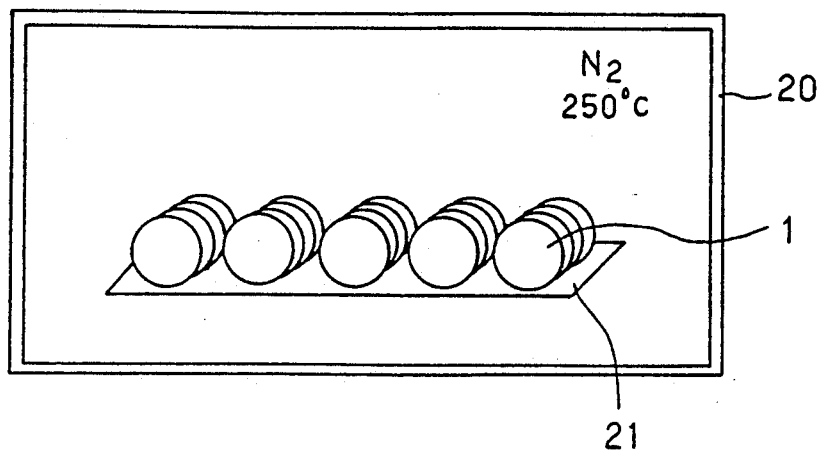
FIG. 15 is a typical view of a heat treatment apparatus for the low-temperature heat treatment of a work after a wafer processing process in the nonvolatile memory cell fabricating method.

After forming the passivation film 18, the work is heated, for example, at 450° C. for several tens minutes for annealing to reduce the surface state density in the surface of the substrate. Then, as shown in FIG. 15, the work held on a substrate holder 21 is subjected to low-temperature heat treatment, for example, at 250° C. for 50 hr in the presence of an inert gas in a thermostatic oven 20 to repair the damaged tunnel oxide film 7 damaged in the wafer processing processes described with reference to FIGS. 9 to 14. Thus, an EEPROM shown in FIG. 1 is completed.

The low-temperature heat treatment process will be described hereinafter.

The oxide film is liable to be damaged by the wafer processing process including the dry etching process, the ion implantation process and the plasma CVD process and the damage inflicted on the oxide film is not ignorable in view of reliability when the oxide film is a thin oxide film, such as the tunnel oxide film of a thickness on the order of 100Å. Damage inflicted on the oxide film before forming the aluminum wiring film can be repaired by subjecting the oxide film to high-temperature annealing at a high temperature on the order of 1000° C. in a N$_2$ atmosphere before forming the aluminum wiring film. However, the oxide film cannot be subjected to high-temperature annealing to repair damage inflicted thereon by the passivating process, which is subsequent to the aluminum wiring film forming process.

The inventors of the present invention found through experiments that low-temperature heat treatment of the oxide film after the passivating process, namely, after the completion of the wafer processing process, is effective on the extension of the life of the memory cell and on the reduction of the difference in life between memory cells of different lots.

Figure 16:
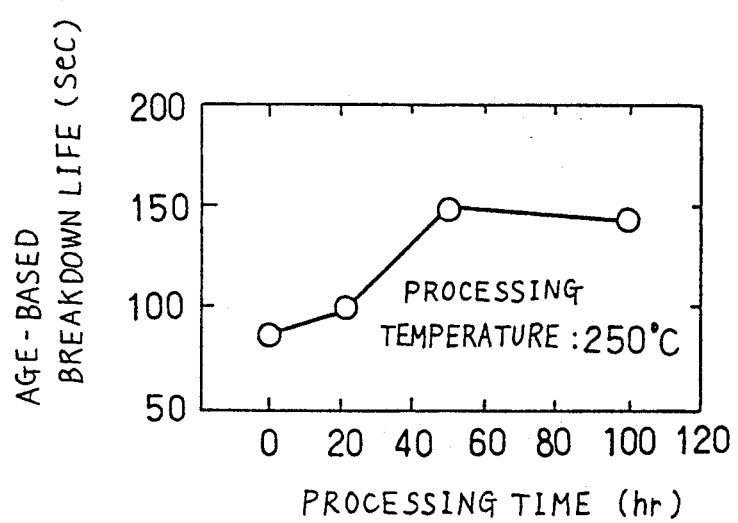
FIG. 16 is a graph showing the variation of the age-based breakdown life of a tunnel oxide film with the processing time of a low-temperature heat treatment.

FIG. 16 shows the dependence of the age-based breakdown life of the tunnel oxide film on the processing time of low-temperature heat treatment at 250° C.

As is obvious from FIG. 16, the age-based breakdown life of the tunnel oxide film heat-treated at 250° C. for 50 hr is about twice that of the oxide tunnel film before low-temperature heat treatment.

Figure 17:
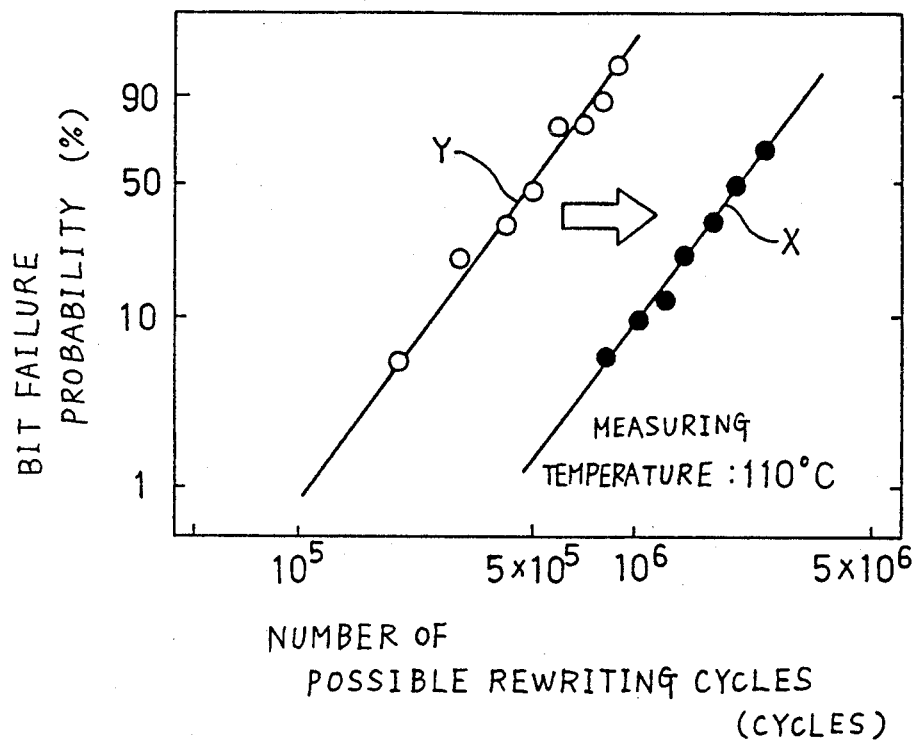
FIG. 17 is a graph showing the measured endurance characteristics of an EEPROM.

FIG. 17 shows the results of the endurance test of EEPROMs having the tunnel oxide film heat-treated at 250° C. for 50 hr (the curve X) and EEPROMs having the tunnel oxide film not repaired by low-temperature heat treatment (the curve Y). In the endurance test, EEPROMs were screened by stressing the EEPROMs with pulses at a predetermined period at 110° C. FIG. 17 is a Weibull probability diagram, in which the number of rewriting cycles is measured on the horizontal axis and bit failure probability is measured on the vertical axis. As is obvious from FIG. 17, the low-temperature heat treatment enhances the endurance of the EEPROM greatly; the number of possible rewriting cycles of the EEPROM having the tunnel oxide film heat-treated by the low-temperature heat treatment is about five times that of the EEPROM having the tunnel oxide film not heat-treated by the low-temperature heat treatment.

Figure 18:
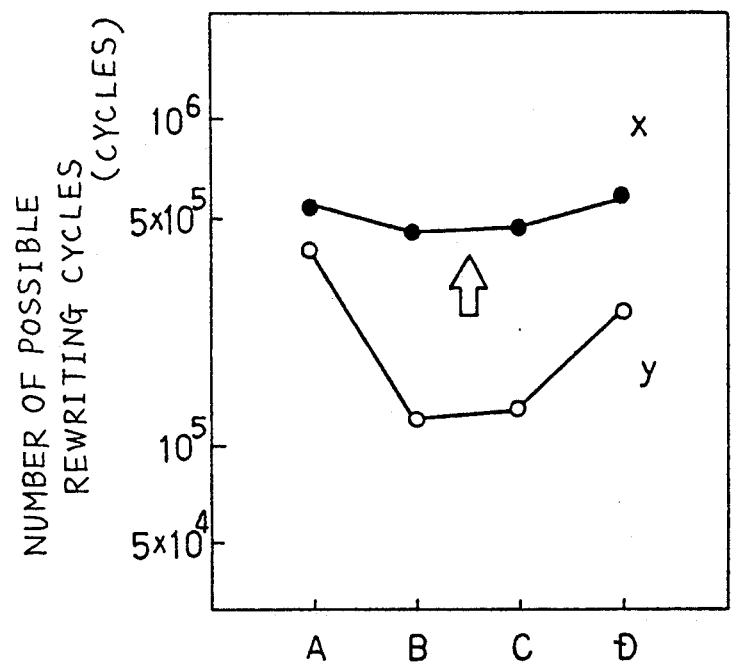
FIG. 18 is a graph comparatively showing the respective rewrite lives of EEPROMs of different lots.

FIG. 18 shows the respective numbers of possible rewriting cycles of the EEPROMs of different lots A, B, C and D before the low-temperature heat treatment (the curve Y) and after the low-temperature heat treatment (the curve X). The difference in the number of possible rewriting cycles between the EEPROMs of different lots before the low-temperature heat treatment is large, whereas the difference in the number of possible rewriting cycles between the EEPROMs of different lots after the low-temperature heat treatment (250° C.×50 hr) is small. As is obvious from FIG. 18, the low-temperature heat treatment is effective on the reduction of large difference in the number of possible rewriting cycles between the EEPROMs of different lots as well as in increasing the number of possible rewriting cycles of the EEPROMs.

The effect of the low-temperature heat treatment on the improvement of the life of the EEPROM will be reasoned hereinafter.

Generally, the passivation film of memory cells is formed of silicon nitride. Since a silicon nitride film can be formed at a temperature not higher than 400° C., a plasma CVD process is employed in forming a passivation film of silicon nitride. However, as mentioned above, it was proved that the tunnel oxide film is damaged and trap sites are formed in the tunnel oxide film in forming a passivation film by a plasma CVD process. In rewriting data in an EEPROM, a tunnel current flows through the tunnel oxide film. Electrons are liable to be trapped by the trap sites. The intensity of the internal electric field of the tunnel oxide film increases with the increase of the trapped electrons and, finally, the breakdown of the tunnel oxide film occurs to make rewriting impossible. Accordingly, it is possible to extend the life of the tunnel oxide film by reducing or eliminating trap sites in the tunnel oxide film to reduce trapped electrons.

The trap sites produced in the tunnel oxide film are classified into intrinsic trap sites formed by the wafer processing process and extrinsic trap sites formed by the rewriting operation. It is inferred that the low-temperature heat treatment reduces or eliminates the intrinsic trap sites and that the effect of the low-temperature heat treatment on the extension of the life of the tunnel oxide film, namely, the improvement of the endurance of the tunnel oxide film, is due to the reduction or extinction of the intrinsic trap sites. It is considered that the low-temperature heat treatment thus extends the life of the tunnel oxide film and reduces the difference in performance between the EEPROMs of different lots.

Figure 19:
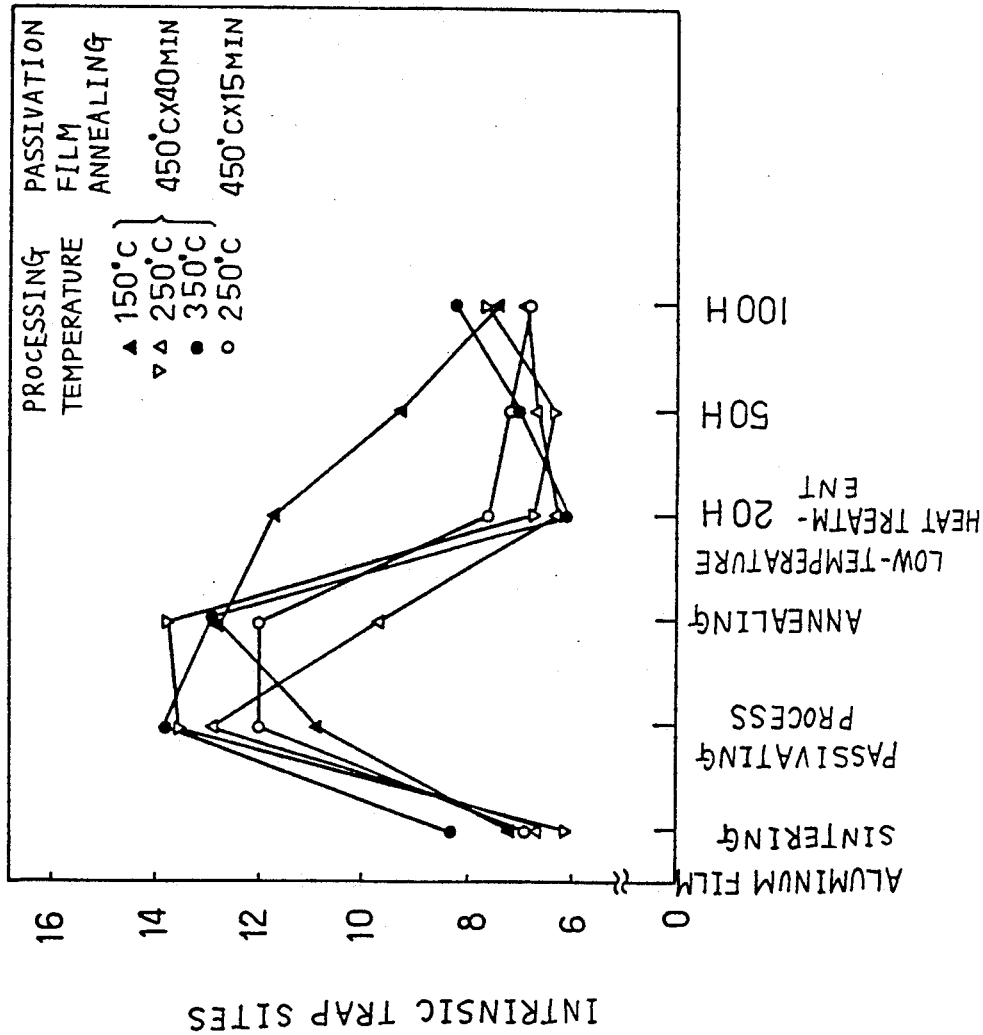
FIG. 19 is a graph showing the variation of the amount of initial trap sites in a tunnel oxide film after a wafer processing process.

FIG. 19 is a graph showing the dependence of the quantity of intrinsic trap sites on the temperature and processing time of the low-temperature heat treatment. As is obvious from FIG. 19, the quantity of the intrinsic trap sites increased by plasma CVD is reduced by the low-temperature heat treatment. When the processing temperature is 250° C., the quantity of the intrinsic trap sites is reduced to a minimum in about 50 hr, which is equal to the processing time that makes the breakdown life a maximum.

Figure 20:
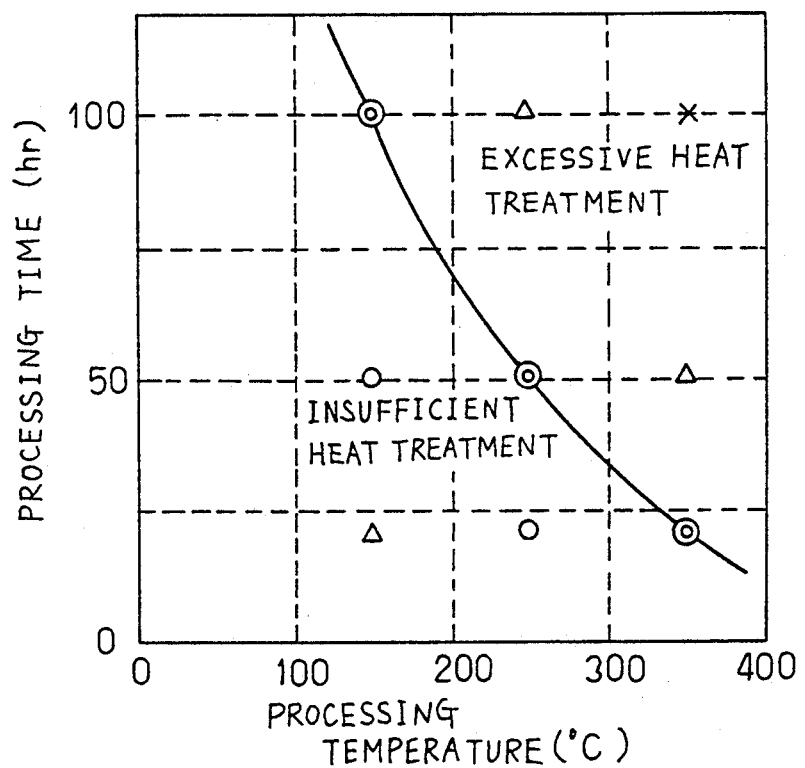
FIG. 20 is a graph of assistance in explaining an optimum heat treatment conditions.

It is known from FIG. 19 that an optimum processing time for the low-temperature heat treatment is dependent on the processing temperature of the low-temperature heat treatment. FIG. 20 is a graph showing the relation between the processing temperature and a corresponding optimum processing time for the low-temperature heat treatment. When the low-temperature heat treatment employs a processing temperature and processing time meeting the curve shown in FIG. 20, the trap site density is reduced to a minimum and the breakdown life is increased to a maximum. The curve in the temperature range of 150° to 350° C. is expressed by:

$$H = -94 \ln(T) + 570 \tag{1}$$

where H (hr) is processing time, T (°C.) is processing temperature.

From FIG. 20, optimum combinations of processing time and processing temperature for the low-temperature heat treatment, for example, are: 150° C.×100 hr, 250° C.×50 hr and 350° C.×20 hr. Since combinations of processing time and processing temperature in an area on the left-hand side of the curve are able to reduce the trap density to some extent and to extend the life of the tunnel oxide film more or less, the effect of the low-temperature heat treatment employing such combinations is not insufficient. On the other hand, combinations of processing time and processing temperature in an area on the right-hand side of the curve increases the trap density and the low-temperature heat treatment employing such combinations is excessively intensive. Therefore, the process conditions of the low-temperature heat treatment must not deviate greatly from the optimum conditions represented by the curve.

Although a higher processing temperature is able to reduce the trap density to a minimum in a shorter processing time, as is obvious from FIG. 19, a high processing temperature is liable to entail excessive heat treatment and difficulty in controlling the processing time. On the other hand, although the trap density decreases gradually and hence the processing time to reduce the trap density to a minimum can be easily controlled when a low processing temperature is selected, the low-temperature heat treatment requires an excessively long processing time.

Accordingly, a desirable processing temperatures is, for example, in the range of 150° C. to 350° C., which is lower than the processing temperature for the process of forming the passivation film, and a corresponding effective processing time may be in an allowable range on both sides of the curve in FIG. 20. It was confirmed that a maximum effective processing time for a processing temperature T is (500−T)/2 (hr). In FIG. 20, double circles indicate optimum processing conditions, circles indicate effective processing conditions, triangles indicate moderately good processing conditions and crosses indicate ineffective processing conditions.

As is apparent from the foregoing description, the nonvolatile memory cell fabricating method embodying the present invention reduces trap sites produced in the tunnel oxide film by the plasma CVD process for forming the passivation film and repairs the tunnel oxide film damaged by the plasma CVD by subjecting the work to low-temperature heat treatment after completing the wafer processing process including the passivating process. The reduction of the trap density by the low-temperature heat treatment increases the endurance of the nonvolatile memory cell greatly. The low-temperature heat treatment at a relatively low processing temperature for a corresponding processing time reduces the trap density of the tunnel oxide film to a satisfactorily low extent and does not deteriorate the aluminum wiring film.

Although the present invention has been described as applied to the fabrication of an EEPROM of a floating gate construction, the present invention is not limited thereto in its application; the trap density reducing method of the present invention is effectively applicable to the improvement of the film quality of an oxide film to which an electric field is applied, particularly, to the improvement of the film quality of a very thin oxide film such as the tunnel oxide film; the volatile memory cell fabricating method of the present invention is applicable also, for example, to the fabrication of an EEPROM of a MNOS type which stores electric charges in a silicon nitride film through a thin oxide film; and the trap density reducing method of the present invention is effectively applicable to the improvement of the gate oxide film of a liquid crystal driving TFT, the substrate of which must not be heated at a high temperature. In fabricating an EEPROM of a FLOTOX construction, the sequence of the steps of the volatile memory cell fabricating method may be changed; the drain of the memory transistor may be formed after forming the tunnel oxide film.

What is claimed is:

1. A method of fabricating a semiconductor device which has an oxide film to which an electric field is applied, said method comprising the steps of:
   forming said oxide film on a substrate;
   forming a passivation film over said substrate and said oxide film at a first processing temperature whereby carrier trap sites are formed in said oxide film; and
   heating said substrate, said oxide film and said passivation film at a second processing temperature T lower than said first processing temperature for a predetermined processing time to reduce a density of said trap sites.

2. A method of fabricating a semiconductor device according to claim 1, wherein said step of forming said passivation film includes a step of forming said passivation film by a plasma process.

3. A method of fabricating a semiconductor device according to claim 2, wherein said step of forming said passivation film includes a step of forming a silicon nitride film by a plasma CVD process.

4. A method of fabricating a semiconductor device according to claim 1, further comprising forming an electrode on said oxide film, wherein said electric field is applied across said electrode and said substrate.

5. A method of fabricating a semiconductor device according to claim 1, further comprising forming an aluminum film on said substrate before said passivation film is formed, said second processing temperature T being at most 450° C.

6. A method of fabricating a semiconductor device according to claim 5, wherein said second processing temperature T is in the range of about 150° C. to about 350° C.

7. A method of fabricating a semiconductor device according to claim 1, wherein said predetermined processing time is at most $(500-T)/2$ hours.

8. A method of fabricating a semiconductor device according to claim 7, wherein said predetermined processing time is at least $(-0.3 \times T + 95)$ hours.

9. A method of fabricating a semiconductor device according to claim 8, wherein said second processing temperature T is about 250° C. and said predetermined processing time is at most about 50 hours.

10. A method as in claim 1 wherein the relationship between said second processing temperature T and said predetermined processing time is approximately in accordance with the following equation:

$$H = -94 ln(T) + 570$$

wherein H represents the processing time in hours and T is in °C.

11. A method of fabricating a nonvolatile memory cell capable of nonvolatile storage of information by changing threshold of a MOS transistor structure thereof by arresting carriers between a gate and a substrate thereof, said method comprising the steps of:
   forming a tunnel oxide film of a thickness that enables said carriers to tunnel therethrough when an electric field is applied across said gate and said substrate;
   forming a passivation film over said substrate, said gate and said tunnel oxide film by a plasma process at a first processing temperature whereby carrier trap sites are formed in said tunnel oxide film; and
   heating said substrate, said gate, said tunnel oxide film and said passivation film at a second processing temperature T lower than said first processing temperature for a predetermined processing time to reduce the density of said trap sites.

12. A method of fabricating a nonvolatile memory cell according to claim 11, wherein said step of forming said passivation film includes a step of forming a silicon nitride film by a plasma CVD process.

13. A method of fabricating a nonvolatile memory cell according to claim 11, further comprising a step of forming an aluminum film on said substrate before said passivation film is formed, said second processing temperature T being at most 450° C.

14. A method of fabricating a nonvolatile memory cell according to claim 11, wherein said predetermined processing time is at most $(500-T)/2$ hours.

15. A method of fabricating a nonvolatile memory cell according to claim 14, wherein said predetermined processing time is at least $(-0.3 \times T + 95)$ hours.

16. A method of fabricating a nonvolatile memory cell according to claim 11, further comprising a step, before said heating step, of heating said substrate, said gate, said tunnel oxide film and said passivation film at a third processing temperature higher than said second processing temperature, to reduce the surface state density of a surface of said substrate.

17. A method as in claim 11 wherein the relationship between said second processing temperature T and said predetermined processing time is approximately in accordance with the following equation $$H = -94 ln(t) + 570$$

wherein H represents the processing time in hours and T is in °C.

* * * * *